United States Patent [19]

Mellitz et al.

[11] Patent Number: 5,596,283
[45] Date of Patent: Jan. 21, 1997

[54] CONTINUOUS MOTION ELECTRICAL CIRCUIT INTERCONNECT TEST METHOD AND APPARATUS

[75] Inventors: Richard I. Mellitz, Pepperell; Michael V. Dowd, Boston, both of Mass.

[73] Assignee: Digital Equipment Corporation, Maynard, Mass.

[21] Appl. No.: 579,038

[22] Filed: Dec. 19, 1995

Related U.S. Application Data

[63] Continuation of Ser. No. 324,293, Oct. 17, 1994, abandoned, which is a continuation of Ser. No. 103,725, Aug. 6, 1993, abandoned, which is a continuation of Ser. No. 721,043, Jun. 26, 1991, abandoned.

[51] Int. Cl.$^6$ .............................. G01R 1/06; G01R 27/26
[52] U.S. Cl. ........................ 324/754; 324/537; 324/690
[58] Field of Search .................................. 324/501, 537, 324/658, 671, 686, 690, 754, 755, 538; 209/573

[56] References Cited

U.S. PATENT DOCUMENTS

| | | | |
|---|---|---|---|
| 836,359 | 11/1906 | Behrend | 324/158 MG |
| 1,412,051 | 4/1922 | Gaalaas | 324/158 MG |
| 1,537,490 | 5/1925 | Oman | 324/158 MG |
| 1,967,296 | 7/1934 | Dixon et al. | 324/158.1 |
| 2,653,298 | 9/1953 | McKinley | 324/690 |
| 2,721,976 | 10/1955 | Wojceichowski | 324/690 |
| 3,348,313 | 10/1967 | Urmenyi | 324/671 |
| 3,393,799 | 7/1968 | Schmersal | 324/671 |
| 3,915,850 | 10/1975 | Crownover | 209/573 |
| 4,046,258 | 9/1977 | Damm | 324/671 |
| 4,169,244 | 9/1979 | Plows | 324/501 |
| 4,565,966 | 1/1986 | Burr et al. | 324/158 F |
| 4,985,681 | 1/1991 | Brunner et al. | 324/501 |
| 5,057,773 | 10/1991 | Golladay et al. | 324/501 |

FOREIGN PATENT DOCUMENTS

| | | |
|---|---|---|
| 2311903 | 3/1973 | Germany . |

OTHER PUBLICATIONS

"Testing of Printed Circuit Boards With Movable Probes Before Mounting Components", J. A. Conti, Elektronik Produktion and Pruftechnik, Mar. 1987, pp. 70–72.

Primary Examiner—Ernest F. Karlsen
Attorney, Agent, or Firm—Mary M. Steubing

[57] ABSTRACT

Electrical test method and apparatus for performing the method. The method operates to determine an electrical characteristic of a node (2) disposed upon a surface of a substrate (3), such as a printed wiring board (PWB). The method includes a first step of providing relative motion between a probe (1) and the surface of the PWB. A second step measures the electrical characteristic during a time that there is relative motion between the probe and the surface of the PWB. In one embodiment of the invention the step of measuring measures capacitance while in another embodiment of the invention the step of measuring measures charge capacity. The step of providing relative motion, in one embodiment of the invention, includes the steps of maintaining the PWB stationary while linearly translating the probe over the surface. In another embodiment of the invention the step of providing relative motion includes the steps of maintaining the probe stationary while moving the PWB.

7 Claims, 4 Drawing Sheets

CONTINUOUS MOTION ELECTRICAL CIRCUIT INTERCONNECT TEST METHOD AND APPARATUS

This application is a continuation of application Ser. No. 08/324,293, filed Oct. 17, 1994, now abandoned, which is a continuation of application Ser. No. 08/103,725, filed Aug. 6, 1993, now abandoned, which is a continuation of application Ser. No. 07/721,043, filed Jun. 26, 1991, now abandoned.

FIELD OF THE INVENTION

This invention relates generally to electrical test method and apparatus and, in particular, to electrical test method and apparatus that employs a test probe for measuring an electrical characteristic associated with nodes disposed upon a substrate, such as a printed wiring board (PWB).

BACKGROUND OF THE INVENTION

At present, there are two approaches for testing the integrity and quality of electrical interconnections upon PWBs. A first approach is based upon a Bed of Nails (BON) tester. A BON tester employs a large number of test pins that are simultaneously contacted to the PWB under test to provide a rapid test that is well suited to high volume manufacturing environments. However, BON testers rely upon product-specific, custom-built test fixtures that require a significant investment of both development time and money. Also, as circuit feature sizes become smaller, BON fixturing and testing becomes increasingly difficult. At present, a lower limit of circuit feature spacing than can be reliably tested by the BON approach is approximately 0.025 inches. Circuit feature spacing below 0.025 inches is sometimes accommodated by the BON approach, for small portions of the product under test, but at an additional expense. Furthermore, as circuit fabrication technology evolves, the gap between substrate test requirements and BON capabilities will undoubtedly grow wider.

In response to the shortcomings of BON testers, flying probe testers have been developed. As depicted in FIG. 1 a flying probe tester employs a motion system to move at least one test probe 1 to circuit nodes 2 on a PWB 3 under test. As indicated by the arrow (A) a test cycle consists of raising the probe 1 off of the PWB, moving the probe 1 to a position over a next circuit node to be tested, moving the probe 1 down to contact the node 2, and making an electrical measurement.

One advantage of flying probe testers is that no custom-built, product-specific fixtures are required. A control program that drives the probe 1 is typically automatically derived from a PWB CAD data base. Another advantage of flying probe testers is that circuit feature spacing as small as 0.004 inches and less can be reliably tested.

However, a primary disadvantage of the flying probe tester is the significant amount of time required to test a complex PWB. During each measurement cycle the flying probe tester spends a significant amount of time waiting for the motion system to move, stop, and settle. In that there are three move-stop-settle delays during each measurement cycle, flying probe testers may require tens of minutes to test a PWB that require only a few minutes on a BON tester.

In U.S. Pat. No. 4,565,966, issued Jan. 21, 1986, entitled "Method and Apparatus for Testing of Electrical Interconnection Networks" to Burr et al. there is described a test system of the flying probe type. A first probe is lowered into contact with the network and the capacitance of the network is measured with respect a reference plate. The capacitance measurement detects open circuit and short circuit conditions of the network. Next, a second probe is lowered into contact with another portion of the network and a resistance measurement is made between the two probes. Capacitance values for a network may be calculated, although a preferred approach is said to learn the capacitive values by direct measurements from a PWB without defects.

The approach taken by Burr et al. requires that the probes be lifted from the PWB, translated to a new position, and lowered back to contact a network being tested. As such, this system of the prior art suffers from the aforementioned disadvantage inherent in the flying probe approach to PWB testing.

It is therefore one object of the invention to provide an electrical network test method and apparatus that overcomes the problems of the prior art by accomplishing testing of a plurality of nodes during a continuous motion of a test probe.

It is a further object of the invention to provide a PWB tester that consecutively measures a capacitance of each of a plurality of adjacent nodes during a time that a test probe is in continuous motion relative to the PWB.

It is another object of the invention to provide a PWB tester that consecutively measures a charge capacity of each of a plurality of adjacent nodes during a time that a test probe is in continuous motion relative to the PWB.

It is a further object of the invention to provide a PWB tester that measures capacitance, termination resistance, and in-circuit characteristics with a continuous motion contact or non-contact probe.

SUMMARY OF THE INVENTION

The foregoing and other problems are overcome and the objects of the invention are realized by an electrical test method, and apparatus for performing the method, of determining an electrical characteristic of a node disposed upon a surface of a substrate. In accordance with the invention the method includes a first step of providing relative motion between a probe and the surface of the substrate; and a second step of measuring the electrical characteristic during a time that there is relative motion between the probe and the surface of the substrate. In one embodiment of the invention the step of measuring measures charge capacity and in another embodiment the step of measuring directly measures capacitance. Measurements of impedance, resistance, and in-circuit electrical characteristics are also within the scope of the invention.

The step of providing relative motion, in one embodiment of the invention, includes the steps of maintaining the substrate stationary while moving the probe. In another embodiment of the invention the step of providing relative motion includes the steps of maintaining the probe stationary while moving the substrate.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Figure 2:
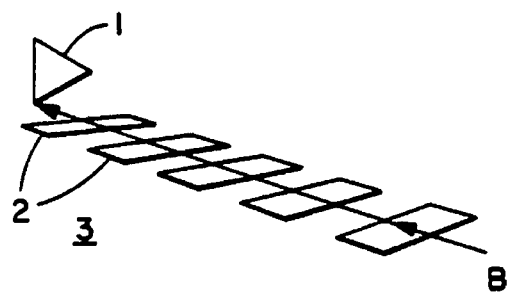
FIG. 2 illustrates a plurality of measurement cycles of a continuous motion tester constructed and operated in accordance with the invention.

Referring to FIG. 2 there is depicted a test probe 1 being linearly translated over a plurality of nodes 2 that are disposed upon a surface of a substrate 3. Substrate 3 is typically a PWB.

In FIG. 2 it can be seen that the path of motion of the probe 1 follows that indicated by the arrow B. That is, motion of the probe 1 is continuous across the surface of the PWB and sequentially contacts individual ones of the nodes 2. As such, the measurement cycle is not temporally discontinuous as in the prior art but is, instead, accomplished by the passage of the probe 1 over the node 2.

Figure 4:
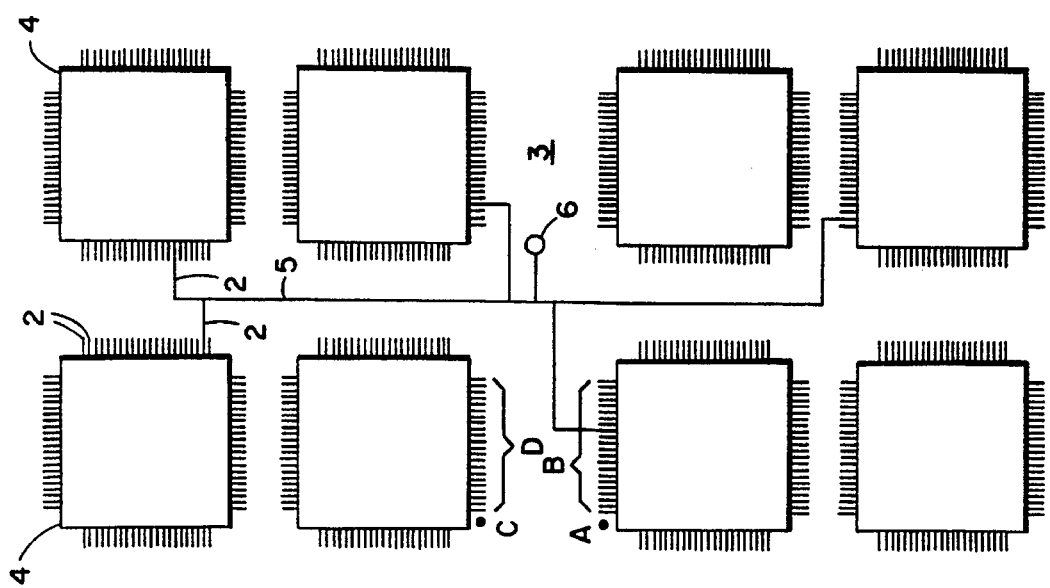
FIG. 4 is an illustrative top view of a PWB showing a plurality of vacant chip sites, some of which are interconnected by a conductive network.

FIG. 4 illustrates a top view of an exemplary PWB having a plurality of integrated circuit or "chip" sites 4, each of which includes a number of the nodes 2. As can be seen, certain of the nodes are interconnected by a conductive trace, also referred to herein as a network 5. The network 5 may also include one or more vias 6 for contacting extensions of the network 5 that are disposed upon another layer or layers of the PWB. In this regard, certain inner layers of the PWB may be power layers or planes which may be electrically contacted and employed as a reference plane during the test of the node or nodes coupled to the network 5. In the illustrated PWB the chip sites are vacant, although it is also within the scope of the invention to test a populated PWB, thereby performing an "in-circuit" measurement.

Figure 3:
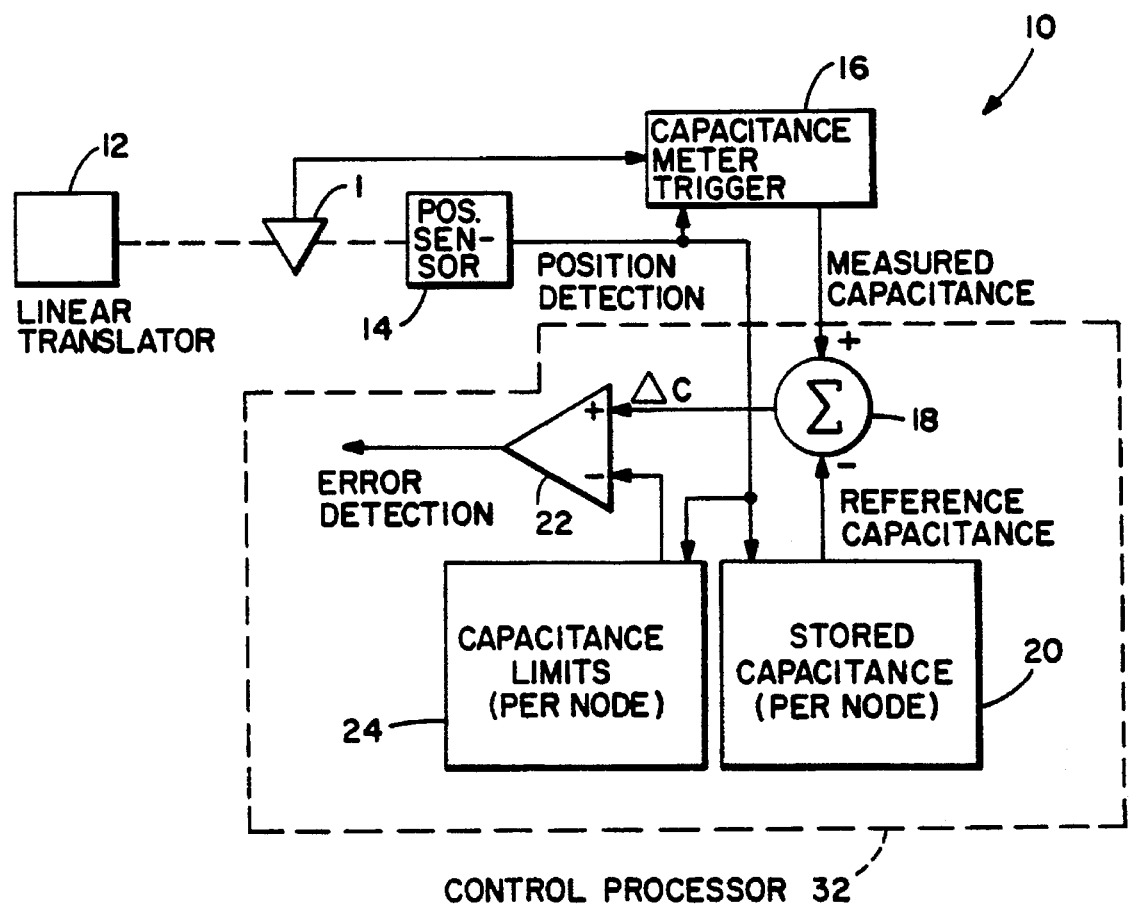
FIG. 3 is a simplified block diagram of the continuous motion electrical tester of the present invention.

Referring to FIG. 3 there is shown a simplified block diagram of a test system 10 constructed and operated in accordance with invention. System 10 includes a linear translator 12 that is coupled to the probe 1 for translating the probe in the manner shown in FIG. 2. Also coupled to the probe 1 is a position sensor 14 having a position detection output. An output of the probe 1 is coupled to, in this embodiment of the invention, a capacitance meter 16. The position detection output is coupled to a triggering input of the capacitance meter 16. The position detection signal is asserted when the probe 1 is determined to be at a position occupied by one of the nodes 2. The assertion of the position detection signal causes the capacitance meter 16 to make a capacitance measurement, the capacitance measurement indicating the capacitance of the network 5 to which the node 2 is attached.

The measured capacitance is applied to one input of a summing junction 18. A second input to the summing junction 18 is supplied from a memory 20 that stores, on a per node basis, a previously measured or a calculated value of capacitance. The position detection output is also supplied to the memory 20 for accessing a location that corresponds to the node located at the detected position. The output of the summing junction 16 indicates a difference in capacitance (delta C) between the measured value and the reference value stored within the memory 20. This difference value is applied to a comparator 22 that compares the difference value to a predetermined limit or tolerance value for the node located at the current position of the probe 1. The limit value may be a constant. Preferably, the limit value is obtained from a second memory 24 that stores a limit or tolerance for each of the nodes. For this case the position detection output is also applied to the memory 24 for accessing same. If desired, the memories 20 and 24 could be combined into a common memory wherein a portion of each addressable location stores the reference capacitance value while another portion of the location stores the tolerance associated with the reference capacitance. If the difference in capacitance for a given node exceeds the tolerance value an error detection signal is generated by the comparator 22.

Figure 5:
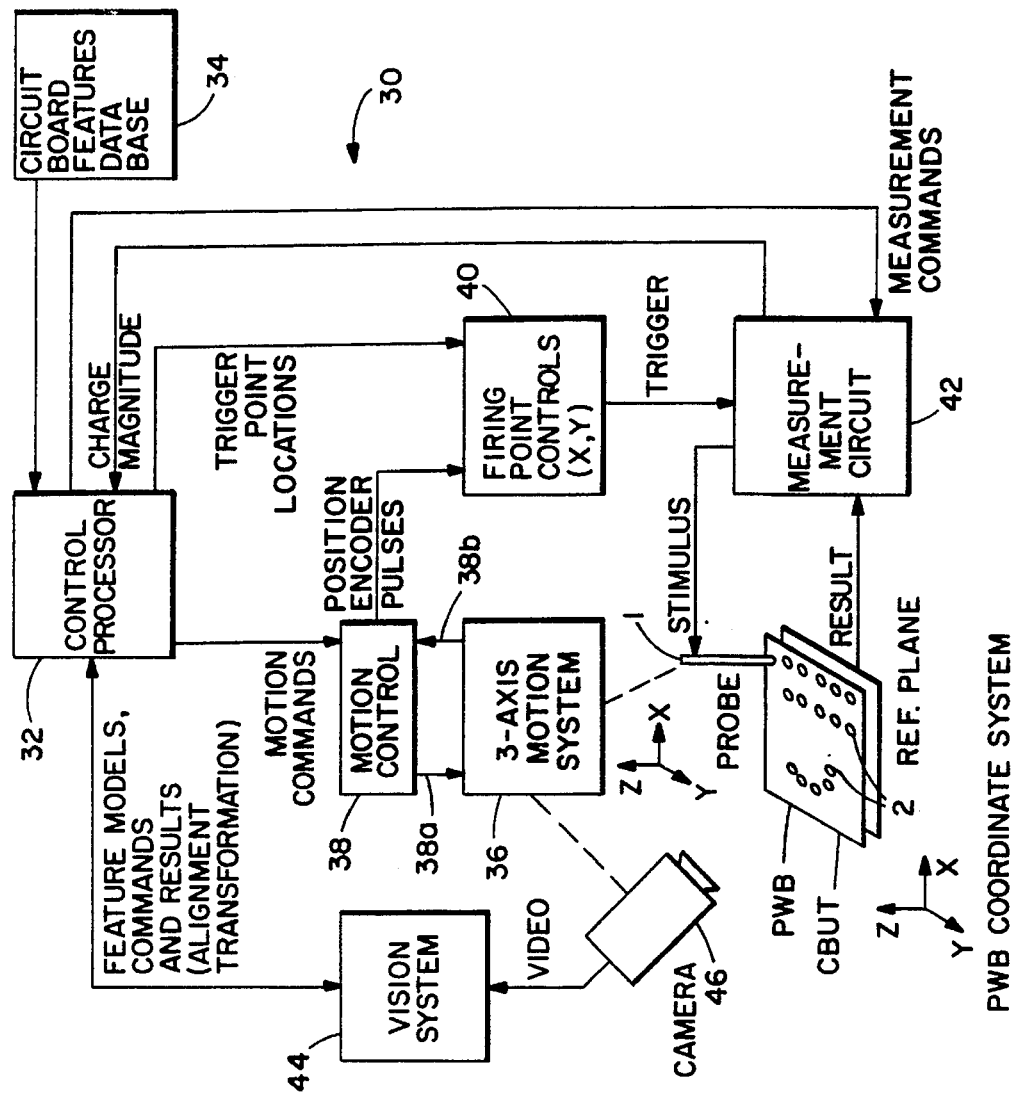
FIG. 5 is a block diagram that illustrates in greater detail the construction of the continuous motion tester of the invention.

The components within the dashed box may all be contained within a data processor, or measurement control processor 32, as shown in FIG. 5.

Referring now to FIG. 5 there is illustrated an embodiment of the continuous motion test system 30 of the invention.

System 30 includes the measurement control processor 32 that is coupled to other components of the system. One input to the control processor 32 is from a circuit board features data base 34. This input provides the location of nodes on the PWB being tested, the locations being referenced to a PWB x-y coordinate system. The system 30 includes a 3-axis motion system 36 and a motion controller 38. The 3-axis motion system 36 enables the probe 1 to be positioned at any point on or above the PWB. Each of the three controlled axis includes a position encoder that generates some predetermined number of pulses per increment of travel. The position encoder enables the motion controllers 38 to determine the direction, speed, and relative position of each of the associated axes. Motion commands are provided from the control processor 32 to the motion controllers 38. The motion controllers 38 are arranged such that there is provided a motion controller for each axis that receives motion commands from the control processor 32. The motion controllers 38 convert the motion commands to motor currents 38a for driving a motor associated with each of the three axes of the 3-axis motion system 36. Position and encoder feedback 38b is provided from the 3-axis motion system 36 to the motion controllers 38.

In a present embodiment a split-axis system is employed, wherein the y-axis is supported by a table and where the x-axis traverses a bridge disposed above the table. The PWB rides on the table (y-axis), while the probe 1 is mounted to the z-axis which in turn is carried by the overhead x-axis. Thus, this embodiment provides for movement of both the probe 1 and the PWB.

The motion system also includes two firing point controllers 40, one for each of the x and y axes. Each firing point controller 40 receives position encoder pulses from the motion controller 38 for controlling the respective axis, thereby allowing the firing point controllers to continuously monitor the position of the probe relative to its associated axis. The firing point controllers 40 also receive commands, via a serial input, from the control processor 32. These commands specify specific encoder values where a trigger pulse is to be generated and where a measurement is to be made.

The trigger pulse generated by the firing point controllers 40 is provided to a charge capacity measurement circuit 42. The measurement circuit 42 obtains analog measurements from the PWB and converts the measurement to a digital value.

Figure 6:
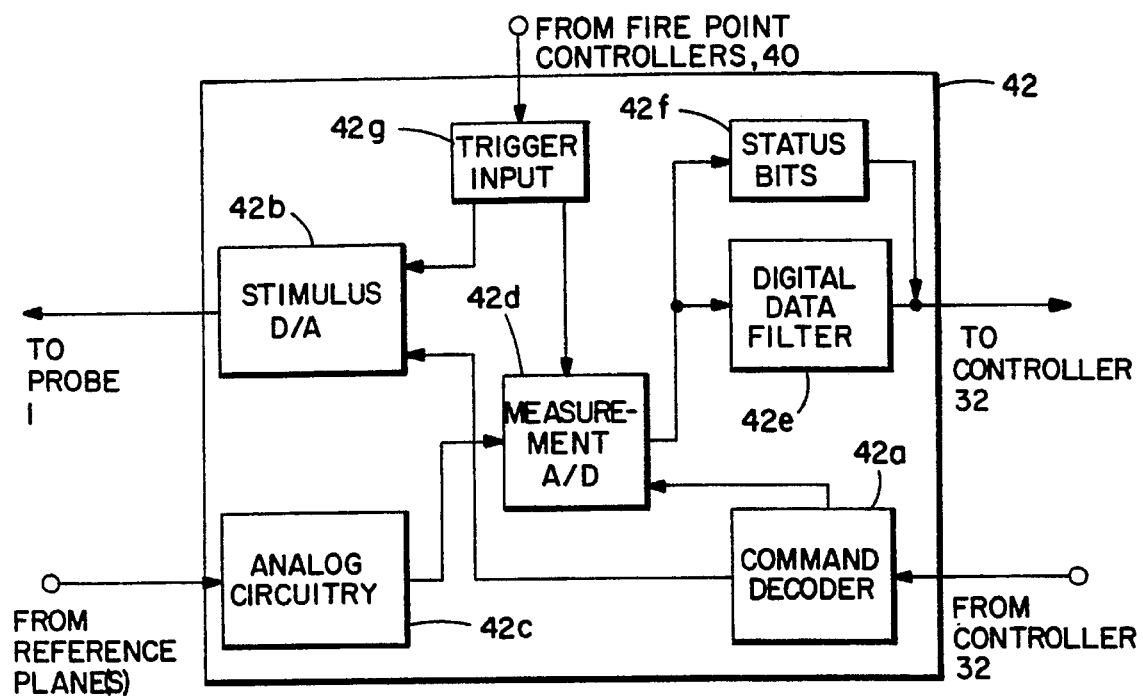
FIG. 6 is block diagram showing in greater detail the measurement system block of FIG. 5.

Referring also to FIG. 6 there is shown the measurement circuit 42 in greater detail. Commands received from the control processor 32 are applied to a command decoder 42a. The commands specify a measurement range, a probe stimulus to be applied, and a number of measurements to be made per node test point. In that a particular measurement, or measurement test cycle, may be made in approximately 18 microseconds, a significant number of measurements are obtained while sliding the probe 1 over a single node 2. The probe 1 is coupled to a probe stimulus digital-to-analog (D/A) converter 42b which provides a selected analog stimulus to the probe 1. For the charge capacity measurement each stimulus pulse is a controlled current. Coupled to a PWB reference plane is analog circuitry 42c that receives a signal generated as a result of the applied stimulus. The output of the analog circuitry is applied to an analog-to-digital (A/D) converter 42d which converts the measured value to a digital signal. The digital signal is applied to a digital data filter 42e which selects a "best" measurement value out of the plurality of measurements, this "best value" being provided to the control processor 32. Presently, a largest magnitude value is selected as the "best value" so as to eliminate erroneous readings due to intermittent or poor probe contact.

It should be realized that certain functionality of the measurement circuit 42, and also the control processor 32, may be accomplished by a local processing device, such as a microprocessor. The use of the local processor enables "best value" selections to be made in real time, including the screening out of low measurement values caused by probe bounce and the smoothing of the remaining data to reduce noise effects. The local processor may also be programmed to perform the functions of the fire point controllers 40.

One or more status bits may be applied to the digital output by status bits block 42f. These status bits are employed to indicate the measurement quality or the occurrence of an error condition. For example, the measurement circuit 42 sets an error status bit if more than one "synch" pulse occurs before an "acquire data" operation. This condition indicates that one or more measurements were made by the measurement circuit 42 but that one or more of the measurements were not acquired by the control processor 32. To alleviate this condition measurements may be buffered by the measurement circuit 42 to reduce the communication rate with the control processor 32. The operation of the measurement circuit 42 for performing a series of measurements is obtained from the trigger input block 42g which receives a trigger input signal from the firing point controllers 40.

Figure 7:
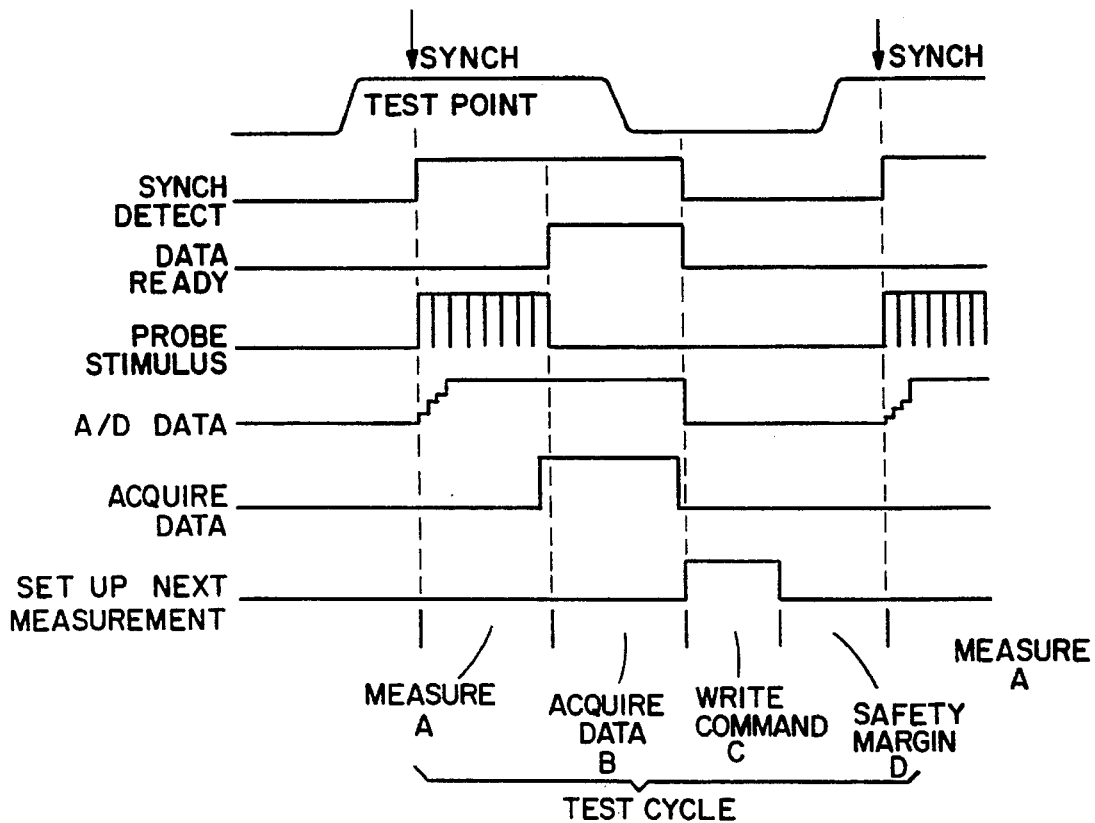
FIG. 7 is a timing diagram showing the operation of the measurement system block of FIGS. 5 and 6.

The operation of the measurement circuit 42 is also illustrated in the timing diagram of FIG. 7. For each test point, or node 2, the synchronizing trigger pulse is generated by the firing point controllers 40. The occurrence of the trigger pulse initiates a test cycle. As can be seen, each test cycle is partitioned into four subcycles. These include a Measurement subcycle (A) wherein the probe is stimulated a plurality of times and the A/D converter 42d obtains a number of corresponding measurements. A next subcycle is referred to as an Acquire Data subcycle (B) wherein the best of the measurements is transmitted from the digital data filter 42e to the control processor 32. A next subcycle is a Write Command subcycle (C) wherein the control processor 32 transmits measurement commands to the command decoder 42a for specifying the measurements to be taken for the next node. A Safety Margin subcycle (D) is provided so as to enable the probe 1 to be correctly positioned before the next test cycle begins. A safety margin greater than zero is maintained so that the measurement circuit 42 can receive setup commands before the next measurement is begun, i.e. before the next "synch" pulse.

The safety margin may also be considered as "Extra Time". So long as Extra Time exists, the probe may be moved faster. An error condition occurs when the Measurement subcycle (A) begins before the completion of the Write Command subcycle (C).

Also, for the aforementioned microprocessor-based measurement circuit 42, the Acquire Data (B) and Write Command (C) subcycles may be reduced or eliminated. Inasmuch as the functionality of the Control Processor 32, the Firing Point Controllers 40, and the Measurement Circuit 42 may be combined into one unit for this embodiment, the test cycle is greatly reduced. This proportionally increases the motion velocity and the number of points per second that may be tested.

It should be remembered that during a given test cycle, and during a plurality of consecutive test cycles, the probe 1 is in continuous motion over the surface of the PWB.

Referring again to FIG. 5, the system 30 further includes means for aligning the PWB to the measurement system. In a preferred embodiment of the invention this alignment means is embodied in a vision system 44 that receives a video input from a camera 46. The vision system 44 is employed to search for visual models of circuit features on the surface of the PWB. The models are initially created by the control processor 32 based on information stored in the circuit board features data base 34. The vision system 44 operates to automatically locate these features on the PWB and compute an alignment transformation between the PWB coordinate system and the motion system coordinate system, the camera 46 being aligned with the motion system 36 coordinate system. In a presently preferred embodiment of the system 30 the camera 46 is a CCD device and the vision system 44 is embodied in a Cognex 2000 Vision Processor (VP).

The operation of the vision system 44 may be partitioned into several categories, including (a) calibration, (b) camera offset, (c) model creation, (d) motion, (e) model searching, and (f) transformation. These categories are discussed further below.

CALIBRATION:

This procedure need be performed only after major maintenance of the system, such as the replacement of a camera or motion axis. The camera 46 is focused over a visual feature for which the vision system 44 is supplied a geometric description. This feature is located upon the motion system itself, not on the substrate. The camera 46 is then automatically moved first in the X, and then in the Y direction. Each motion moves the visual feature within the camera 46 field of view (FOV). By analyzing the camera 46 pixel locations at each of the three instances (before motion, after X, and after Y) and the length of the X and Y moves, transformations between pixel position and motion system units and axes are generated, since the camera 46 may be rotated relative to the motion system axes.

CAMERA OFFSET:

A present embodiment employs a semi-automatic process to determine the probe-to-camera offset. A user of the system directs the probe 1 to a visual feature, and then the Control Processor 32 locates the same feature with the vision system 44. The X-Y offset, in motion system units, is stored to transform between the probe 1 and corresponding camera 46 location.

MODEL CREATION:

The CAD database 34 contains geometric descriptions and dimensions of circuit features. Three or more of these descriptions, along with their CAD coordinates, are included in a test file supplied to, or generated by, the Control Processor 32. When the Control Processor 32 executes test file commands, the descriptions are transmitted to the vision system 44. A program within the vision system 44 interprets the descriptions and builds therefrom a bitmap model of the corresponding circuit feature, the bitmap model being of the appropriate size and orientation. A library of such models is maintained so that frequently used models need not be recreated for each instance of the circuit feature.

MOTION:

The Control Processor 32 commands the motion system to position the camera 46 over an estimated position of the circuit feature to be located, using the CAD coordinates of the feature and an estimated CAD-to-motion system offset. If needed, the user may reposition the camera 46, or the substrate under test, to bring the circuit feature within the FOV of the camera 46. The amount of repositioning is recorded by the Control Processor 32. This is repeated for each of the circuit features used for alignment, although repositioning by the user becomes unnecessary as the system applies the alignment learned from previous locations.

MODEL SEARCHING:

Model searching employs known techniques to perform correlation searching within an image frame, using the user-created model. There is selected the correlation nearest the center of the FOV that exceeds a minimum correlation threshold value.

TRANSFORMATION:

Two transformations are generated based on the matching arrays of CAD coordinate data and motion system coordinate data for each alignment feature. One transformation converts CAD data to motion system coordinates and is used for positioning the probe 1 on circuit features. The other transformation yields the CAD coordinate location of the probe 1, over the substrate, based on the current motion system coordinates. These transformations may be applied over the entire substrate under test, or additional alignment features may be employed to create localized transformations where a higher degree of accuracy is required. These transformations compensate for distortions of the substrate, as well as for motion system imperfections, such as non-orthogonal X-Y axes, encoder scaling errors, etc.

In a presently preferred embodiment of the invention the control processor 32 is embodied in a MicroVAX II (TM Digital Equipment Corporation). In addition to controlling the operation of the test system 30 the control processor 32 is also employed, off-line, to generate continuous motion test files from the circuit board features data base 34. The test file is optimized to minimize test time. The optimization process employs acceleration and velocity specifications for each motion system 36 axis, as well as measurement acquisition times, to group nodes into sets and to determine the sequencing of probe motions and placement to minimize the total test time. The control processor 32 also performs a calibration procedure in conjunction with the measurement circuit 42. This calibration procedure is employed to derive conversions to convert the digital values returned from the measurement circuit 42, representative of network charge capacity, to capacitance values expressed, typically, in picofarads.

For the charge capacity measurement, each electrical network has a capacity, or capacitance, to hold a specific quantity of charge. This quantity is proportional in large measure to the physical size of the network. Each network, such as the network 5 of FIG. 4, may be modeled as a physical structure capable of accepting a certain amount of charge. If the capacity of the structure is found to be less than expected, then the network is likely fragmented, resulting in two or more smaller structures. Conversely, if the structure is found to hold more charge than expected, the network is likely attached to another network and combined therewith to form a larger structure. As a result, the control processor 32 is enabled to detect the occurrence of an open, or fragmented, network, or a network shorted to, or combined with, another network.

In this regard it is noted that several factors contribute to the charge capacity, or capacitance, of a network. While physical size may be the largest factor, there are others which may or may not be easily quantified based on CAD data.

If a capacitance measurement is employed the measurement circuit 42 may be a commercially available device such as one manufactured by Hewlett Packard, Model No. HP 4278A. For this case the returned values are expressed directly in capacitance units.

In a presently preferred embodiment of the system 30 the motion system 36, motion controller 38 and firing point controllers 40 are components manufactured by Anorad Inc. The motion controllers 38 are model numbers IAC-186 and the firing point controllers 40 are each a model FD-186. The firing point controllers 40 include a linear motor and a glass scale that generates the encoder counts. The probe 1 is linearly and continuously translated along a rail and the encoder counts are converted to a displacement of the probe 1 relative to an end of the rail.

In use, the probe is precisely positioned at a location upon the PWB. This placement is accomplished automatically with the 3-axis motion system 36 and motion controller 38 driven by position information obtained from data base 34 and the output of the vision system 44. After placement, the probe tip contacts the surface of the PWB. The probe is then linearly translated across the surface of the PWB and contacts in succession a plurality of the nodes 2. By example, in FIG. 4 the probe 1 is initially positioned at the point A and is linearly translated to contact the group of nodes labeled B. After making this group of measurements, the probe 1 is repositioned to point C and is linearly translated to contact the group of nodes labeled D, etc. Inasmuch as the starting position coordinates of the probe 1 are known, a displacement of the probe from the initial starting position is compared to the known positions of the nodes. The firing point controllers 40 thus generate the trigger signal when the probe position is determined to coincide with the position of a particular one of the nodes 2. The firing point controllers 40 are capable of generating up to 2000 synchronization trigger pulses per second.

Figure 9A:
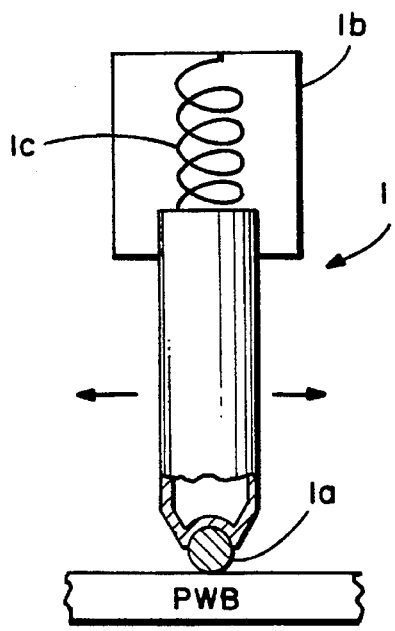
FIG. 9a illustrates one embodiment of a test probe capable of omni-directional movement.
Figure 9B:
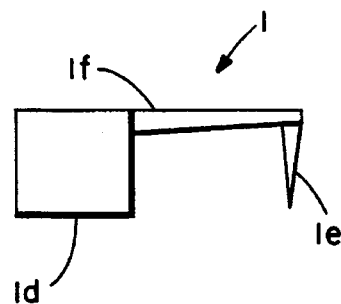
FIG. 9b illustrates another embodiment of a test probe having the probe mounted in a cantilevered manner.

FIG. 9a illustrates a presently preferred embodiment for the probe 1. The presently preferred embodiment includes a probe body having a rolling ball 1a at the tip that contacts the PWB. The probe 1 is mounted vertically in a perpendicular fashion to the PWB. A probe body holder 1b includes a spring loaded mechanism 1c having a variable preload adjustment. This embodiment of the probe 1 is advantageous in that the rolling ball 1a permits omni-directional movement over the surface of the PWB. The diameter of the ball 1a is selected in accordance with the size of the features being contacted and the spacing between features so that during a given measurement the ball 1a contacts only one node. It should be noted that the rolling ball 1a is not required for operation, in that any smooth, low friction, tip may be employed. Other suitable probe embodiments include, as seen in FIG. 9b, a cantilevered test probe similar in construction to a phonograph needle, with the probe tip corresponding to the needle. The probe 1 in this embodiment includes a body portion 1d and a probe tip 1e that is mounted in a cantilevered fashion on a flexible extension if of the body portion 1d. It is also within the scope of the invention to employ a non-contact probe for conductively coupling to a node under test.

Figure 8:
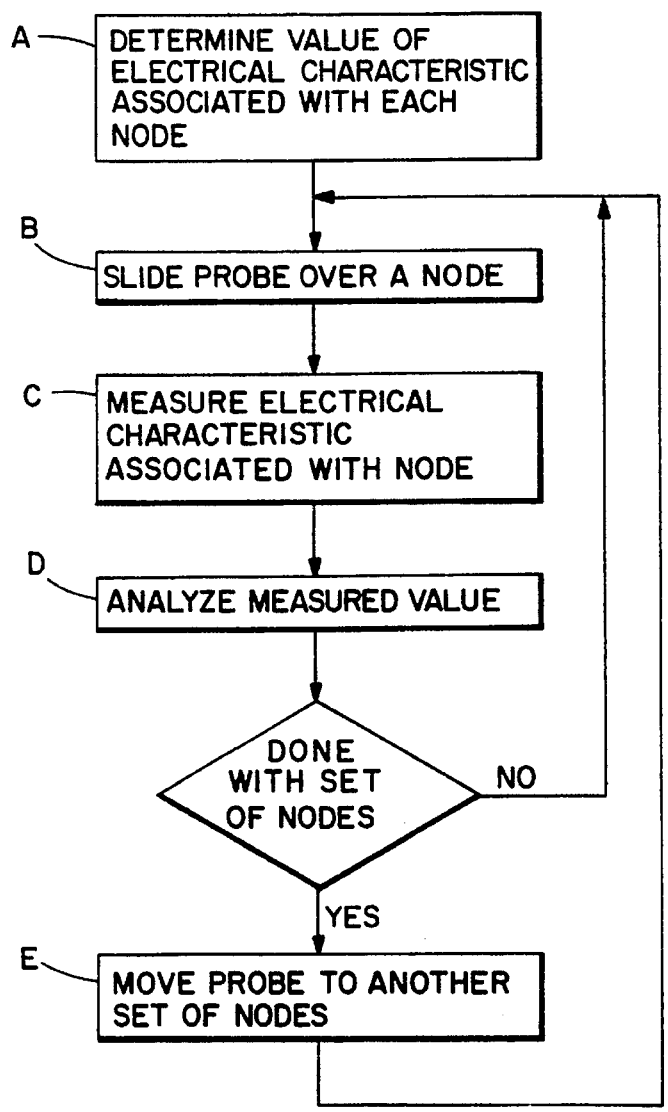
FIG. 8 is a flow chart illustrating a sequence of steps to accomplish a continuous motion test method of the invention.

In accordance with a method of the invention illustrated in FIG. 8 the following steps are executed:

A. determining, or learning, a value of capacitance or charge capacity for all the nodes to be tested on a PWB;

B. sliding the probe over all nodes to be tested on the PWB while maintaining the probe in contact with the PWB and the nodes being tested;

C. while sliding the probe over each node, operating a position synchronization device to trigger the measurement device at a time when the probe is in contact with each of the nodes being tested; and D. analyzing the measured value of each test node to verify the PWB interconnections.

When the measurement of a given set of nodes is complete, either the PWB or the probe 1 is repositioned to another set of nodes (Step E) and the Steps B–D are repeated.

In regard to Step A, the values may be determined by analyzing CAD data for the size and configuration of each electrical network to be tested. A range of acceptable values is also determined for each node to be tested.

These values may be learned by measuring, from a known-good PWB, some or all of the nodes on the network a number of times. For these nodes, a record is kept of a running total of the measured values and the number of elements that were measured to arrive at the total. What is stored is a sum of the values of all nodes 2 on a given network 5 and a value representing the square of the sum. Based on these two parameters a standard deviation or other suitable calculations can be performed. The range of acceptable values for each node is calculated based on the recorded statistics.

Further in regard to Step A it is noted that this step may be done off-line, either before or after performing the test. Thus, an alternative method first completes steps B through E, sand then performs a step of storing the test results for subsequent processing. Further data analysis may be accomplished by the Control Processor 32, or by a computer remote from the test system.

During the "learn" sequence embodied in Step A, three values for each test point are accumulated:

(a) a number of data points (number of PWBs in the learn sequence);

(b) the sum of the values (charge magnitude or capacitance); and (c) the sum of the square of each value.

Figure 1:
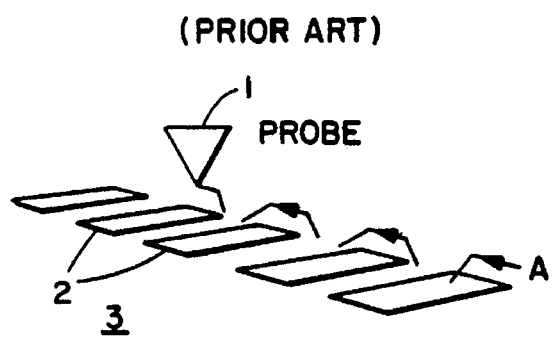
FIG. 1 illustrates a plurality of measurement cycles of a flying probe tester of the prior art.

In regard to Step B, electrical contact is maintained at each test node for sufficient time for measurement acquisition. The probe 1 does not stop at each test node, nor does the probe 1 lift up and put down at each node as in the prior art system illustrated in FIG. 1. This improvement results in significant reductions in total test time for a PWB, in that the test system is not required to wait for the motion system to move and to settle. By example, the system 30 translates the probe at five inches/sec and acquires bursts of measurements at the rate of 10's to 100's of measurements per second. This contrasts sharply with the three to five per second measurement capability of the conventional flying probe systems.

In regard to Step C, the synchronization device, or firing point controller 40, is loaded with the motion system coordinates of the nodes to be tested. Pulses are generated whenever the motion system position encoder coincides with a test node location. These pulses trigger the measurement device to perform a capacitance or charge capacity measurement.

Although described in the context of specific embodiments it should be realized that the teaching of the invention is not to be construed to being limited to only these embodiments. For example, it is within the scope of the invention to maintain the probe 1 stationary and to translate the PWB past the probe tip by coupling the motion system to a stage that supports the PWB. Also, instead of X-axis and Y-axis motions, it is within the scope of the invention to employ a rotary substrate support in conjunction with a radial probe translator. For this embodiment, polar coordinates, as opposed to rectilinear coordinates, are provided to the Fire Point controllers to generate measurement synchronization pulses. The Fire Point controllers compare both rotary and linear encoder counts, corresponding to the rotating substrate stage and to the linearly translated probe, respectively, to the supplied node positions that are expressed in polar coordinates. When a match occurs, the probe 1 is positioned over a node of interest and the measurement synchronization pulse is generated.

Also, other than capacitance or charge capacity measurements may be made. For example, there can be measured termination resistance (from network to reference plane); in-circuit measurements (such as signal level or frequency); and impedance. As such, the system of the invention can be seen to useable for measuring a capacitance characteristic, a resistance characteristic, and/or electromagnetic, magnetic, and electric fields associated with a PWB under test.

Thus, while the invention has been particularly shown and described with respect to exemplary embodiments thereof, it will be understood by those skilled in the art that changes in form and details may be made therein without departing from the scope and spirit of the invention.

What is claimed is:

1. Test apparatus for determining an electrical characteristic of a node disposed upon a surface of a printed wiring board (PWB) substrate comprising:

contact probe means;

means for providing continuous contact and relative omnidirectional motion between the probe means and the surface of the PWB substrate having a plurality of individual nodes disposed upon its surface;

position synchronization means for determining when the probe means is contacting an individual node of said plurality of nodes while there is continuous relative motion between the probe means and the surface of the substrate;

means, coupled to the probe means and responsive to the position synchronization means, for measuring an electrical characteristic of an individual node of the plurality of individual nodes, said electrical characteristic being measured for said individual node of the plurality of nodes when the position synchronization means indicates that said individual node is being contacted by the probe.

2. Apparatus as set forth in claim 1 wherein the measuring means measures capacitance.

3. Apparatus as set forth in claim 1 wherein the measuring means measures charge capacity.

4. Apparatus as set forth in claim 1 wherein the substrate is stationary and wherein the relative motion providing means translates the probe means during a measurement.

5. Apparatus as set forth in claim 1 wherein the probe means is stationary and wherein the relative motion providing means translates the substrate means.

6. Apparatus as set forth in claim 1 and further comprising:

means for storing a reference value for the electrical characteristic; and means, having a first input coupled to an output of the measuring means and a second input coupled to an output of the storing means, for comparing a measured value of the electrical characteristic to the stored reference value.

7. Apparatus as set forth in claim 1 and further comprising means for repositioning the probe means from one location to another location upon the substrate.

* * * * *